United States Patent
Tomoda et al.

(10) Patent No.: US 9,293,434 B2
(45) Date of Patent: Mar. 22, 2016

(54) ELECTRONIC DEVICE MOUNTED ON A SUBSTRATE

(71) Applicant: Sony Corporation, Tokyo (JP)

(72) Inventors: Katsuhiro Tomoda, Kanagawa (JP); Naoki Hirao, Kanagawa (JP); Izuho Hatada, Kanagawa (JP)

(*) Notice: Subject to any disclaimer, the term of this patent is extended or adjusted under 35 U.S.C. 154(b) by 153 days.

(21) Appl. No.: 13/928,508

(22) Filed: Jun. 27, 2013

(65) Prior Publication Data

US 2014/0008691 A1 Jan. 9, 2014

(30) Foreign Application Priority Data

Jul. 4, 2012 (JP) ................................. 2012-150531

(51) Int. Cl.

| | |
|---|---|
| *H01L 33/00* | (2010.01) |
| *H01L 23/48* | (2006.01) |
| *H01L 23/00* | (2006.01) |
| *H01L 31/02* | (2006.01) |
| *H01L 33/38* | (2010.01) |
| *H01L 23/498* | (2006.01) |
| *H01L 23/538* | (2006.01) |
| *H01L 25/075* | (2006.01) |
| *H01L 33/62* | (2010.01) |

(52) U.S. Cl.
CPC .......... *H01L 24/29* (2013.01); *H01L 23/49838* (2013.01); *H01L 23/5389* (2013.01); *H01L 24/05* (2013.01); *H01L 25/0753* (2013.01); *H01L 31/02002* (2013.01); *H01L 33/38* (2013.01); *H01L 33/62* (2013.01); *H01L 2224/16* (2013.01)

(58) Field of Classification Search
CPC ....... H01L 23/481; H01L 24/16; H01L 24/49; H01L 24/45; H01L 23/5389; H01L 24/01; H01L 22/32; H01L 23/485; H01L 33/62; H01L 23/525; H01L 23/49811; H01L 23/538; H01L 27/14636; H01L 33/38; H01L 24/83; H01L 24/73; H01L 31/02002; H01L 23/49838; H01L 24/05; H01L 24/29; H01L 25/0753; H01L 2224/16
USPC .............. 257/99, 435, 79, 88, 690, 773, 741, 257/778, 781, 692, 786
See application file for complete search history.

(56) References Cited

U.S. PATENT DOCUMENTS

| | | | |
|---|---|---|---|
| 2011/0266039 A1* | 11/2011 | Tomoda | 174/260 |
| 2011/0284909 A1* | 11/2011 | Sugizaki | 257/99 |
| 2012/0169786 A1* | 7/2012 | Okuyama et al. | 345/690 |
| 2015/0084537 A1* | 3/2015 | Choi et al. | 315/250 |

FOREIGN PATENT DOCUMENTS

JP 2011-233733 A 11/2011

* cited by examiner

*Primary Examiner* — Shouxiang Hu
(74) *Attorney, Agent, or Firm* — Hazuki International, LLC

(57) ABSTRACT

A device includes: a substrate; and a functional element mounted, the functional element including electrodes. The substrate includes a support substrate, and includes a first seed metal, a second seed metal, and a resin component on the support substrate, the first seed metal being disposed in a section opposed to part or all of a first electrode among the electrodes, and being connected to the first electrode by plating, the second seed metal being disposed in a section opposed to part or all of a second electrode among the electrodes, and being connected to the second electrode by plating, and the resin component being disposed in a layer between the functional element and the support substrate, and fixing the functional element to the support substrate, and being provided avoiding a neighborhood of an end of the functional element among opposed side sections of the first and second seed metals.

10 Claims, 17 Drawing Sheets

ELECTRONIC DEVICE MOUNTED ON A SUBSTRATE

BACKGROUND

The present technology relates to a device having one or more functional elements disposed therein, and an electronic apparatus including the device.

In the case where elements, particularly a large number of small elements, are mounted on a wiring substrate, it is necessary for the elements to be accurately and collectively disposed (transferred) on the wiring substrate. Furthermore, if a large number of small elements are mounted, the following step is necessary to improve a yield: an electrode pad of each element is connected to a wiring line in an electrically and mechanically firm manner after the elements are mounted on the wiring substrate.

For example, Japanese Unexamined Patent Application Publication No. 2011-233733 discloses a fixing method using electrolytic plating. Specifically, first, a seed metal is formed on a substrate, and an element is temporarily fixed to the substrate such that an electrode pad of the element is located above the seed metal in an electrically unconnected manner. Subsequently, electrolytic plating is performed with the seed metal as a power feeding layer, so that the electrode pad is eventually connected to the seed metal through a plated layer growing during such electrolytic plating, and therefore the element is fixed to the substrate.

SUMMARY

In the above-described fixing method, when the connecting operation is performed by plating, a plating solution may remain in a region between the element and the substrate, and thus a reduction in reliability may be caused.

It is desirable to provide a device that is reduced in residual plating solution in a region between an element and a substrate, and an electronic apparatus including the device.

According to an embodiment of the technology, there is provided a device including: a substrate; and a functional element mounted on the substrate, the functional element including a plurality of electrodes disposed on one surface. The substrate includes a support substrate, and includes a first seed metal, a second seed metal, and a resin component on the support substrate, the first seed metal being disposed in a section opposed to part or all of a first electrode among the plurality of electrodes, and being connected to the first electrode by plating, the second seed metal being disposed in a section opposed to part or all of a second electrode among the plurality of electrodes, and being connected to the second electrode by plating, and the resin component being disposed in a layer between the functional element and the support substrate, and fixing the functional element to the support substrate, and being provided avoiding a neighborhood of an end of the functional element among opposed side sections of the first seed metal and the second seed metal.

According to an embodiment of the technology, there is provided an electronic apparatus including: a mounting board including a substrate, and a functional element mounted on the substrate, the functional element including a plurality of electrodes disposed on one surface; and a drive section driving the functional element. The mounting board includes a support substrate, and includes a first seed metal, a second seed metal, and a resin component on the support substrate, the first seed metal being disposed in a section opposed to part or all of a first electrode among the plurality of electrodes, and being connected to the first electrode by plating, the second seed metal being disposed in a section opposed to part or all of a second electrode among the plurality of electrodes, and being connected to the second electrode by plating, and the resin component being disposed in a layer between the functional element and the support substrate, and fixing the functional element to the support substrate, and being provided avoiding a neighborhood of an end of the functional element among opposed side sections of the first seed metal and the second seed metal.

In the device and the electronic apparatus according to the above-described respective embodiments of the technology, the first seed metal and the second seed metal on the support substrate are connected by plating to the first electrode and the second electrode, respectively, of the functional element. Furthermore, the resin component, which fixes the functional element to the support substrate, is provided avoiding the neighborhood of an end of the functional element among the opposed side sections of the first seed metal and the second seed metal. Thus, when connecting operation is performed by plating in a manufacturing process, a plating solution is discharged to the outside from a region between the functional element and the support substrate through a region having no resin component.

According to the device and the electronic apparatus of the above-described respective embodiments of the technology, when connecting operation is performed by plating in a manufacturing process, a plating solution is discharged to the outside from a region between a functional element and a support substrate through a region having no resin component, so that the plating solution less remains in the region between the functional element and the support substrate.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1:
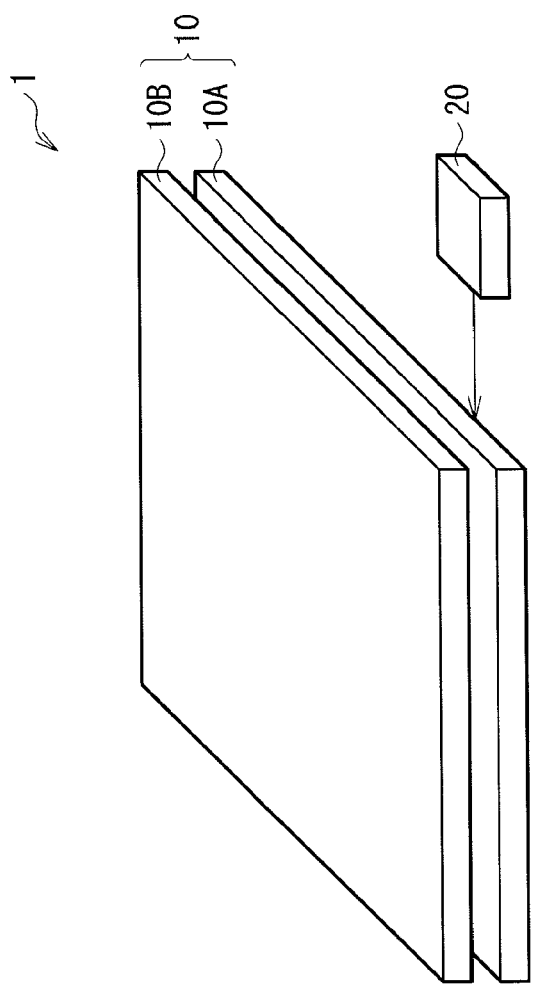
FIG. 1 is a perspective diagram illustrating an exemplary display unit according to a first embodiment of the technology.

Hereinafter, some embodiments of the disclosure will be described in detail with reference to the accompanying drawings. It is to be noted that description is made in the following order.

1. Summary of Present Technology
2. First Embodiment (FIGS. 1 to 8C)
3. Modifications of First Embodiment (FIGS. 9 to 19)
4. Second Embodiment (FIGS. 20 to 22)
5. Modification of Second Embodiment (FIG. 23)
6. Third Embodiment (FIGS. 24 to 26)
7. Modification of Third Embodiment (FIG. 27)
8. Modifications Common to Above-Described Respective Embodiments

[Summary of Present Technology]

The device according to an embodiment of the technology includes a substrate, and a functional element mounted on the substrate. The substrate may have only one functional element or a plurality of functional elements thereon. The substrate may be an element substrate for use in a pixel chip, or may be a wiring substrate for use in a mounting board. Examples of the functional element include a light emitting element, a light receiving element, and a semiconductor element. Examples of the light emitting element include a light emitting diode (LED) chip. Examples of the light receiving element include a photo diode (PD). Examples of the semiconductor element include a circuit block including one or more amorphous thin film transistors (TFTs). The functional element includes a plurality of electrodes disposed on the same surface. The number of electrodes of the functional element may be two or three or more. In the case where the functional element is the light emitting element, the device according to an embodiment of the technology may configure, for example, a display pixel. In the case where the functional element is the light receiving element, the device according to the above-described embodiment of the technology may configure, for example, a light receiving pixel.

The above-described substrate includes a support substrate, and includes a first seed metal, a second seed metal, and a resin component on the support substrate. The first seed metal serves as a power feeding layer in electrolytic plating, and further serves as an electrode pad on which the functional element is to be mounted. The first seed metal is disposed in a section opposed to part or all of a first electrode among the plurality of electrodes, and is connected to the first electrode by plating. As with the first seed metal, the second seed metal serves as a power feeding layer in electrolytic plating, and serves as an electrode pad on which the functional element is to be mounted. The second seed metal is disposed in a section opposed to part or all of a second electrode among the plurality of electrodes, and is connected to the second electrode by plating.

The resin component supports the functional element above the support substrate (i.e., in the air) during electrolytic plating to provide a gap between each electrode of the functional element and each seed metal of the support substrate. The resin component is disposed in a layer between the functional element and the support substrate, and fixes the functional element to the support substrate. Furthermore, the resin component is provided avoiding the neighborhood of an end of the functional element among opposed side sections of the first seed metal and the second seed metal. Thus, when connecting operation is performed by plating in a manufacturing process, a plating solution is discharged to the outside from a region between the functional element and the support substrate through a region having no resin component. As a result, the plating solution less remains in the region between the functional element and the support substrate In the device according to the above-described embodiment of the present technology, the substrate may have a passage that extends along the opposed side sections of the first seed metal and the second seed metal, and runs through the region between the functional element and the support substrate. In such a case, if the first electrode has a recess, it is preferred that the first seed metal be provided avoiding part or all of a section opposed to the recess, and the passage be in communication with the recess. For example, the first seed metal may be configured of two divided seed metals on the same surface, the divided seed metals being opposed to each other with a section opposed to the recess therebetween.

The above-described passage may be formed using a light shielding film described later. Specifically, first, the light shielding film is formed in a layer between the support substrate and the first seed metal as well as between the support substrate and the second seed metal. In detail, the light shielding film is first formed in a section that is not opposed to the resin component, but is opposed to a section in which the passage is to be formed. Subsequently, ultraviolet rays are applied to an uncured photosensitive resin provided in the layer between the functional element and the support substrate while being shielded by the light shielding film, the first seed metal, and the second seed metal.

In the device according to the above-described embodiment of the present technology, the first seed metal, the second seed metal, the first electrode, and the second electrode may each have a right-angled triangle shape, and the first seed metal and the second seed metal may be disposed to have respective hypotenuses opposed to each other. In such a case, the resin component is preferably provided avoiding a section that is opposed to a region between the first seed metal and the second seed metal, but is not opposed to the functional element, and avoiding the neighborhood of the section.

The above-described resin component may be formed using the light shielding film described later. Specifically, first, the light shielding film is formed in a layer between the support substrate and the first seed metal as well as between the support substrate and the second seed metal. In detail, the light shielding film is first formed in a section that is not opposed to a section in which the resin component is to be formed. Subsequently, ultraviolet rays are applied to an uncured photosensitive resin provided in the layer between the functional element and the support substrate while being shielded by the light shielding film, the first seed metal, and the second seed metal.

In the device according to the above-described embodiment of the present technology, when the light shielding film is formed in the layer between the support substrate and the first seed metal as well as between the support substrate and the second seed metal, the light shielding film may be formed in a section that is not opposed to the functional element. In such a case, the resin component is formed only directly below the functional element.

Hereinafter, various embodiments of the present technology are specifically described.

[2. First Embodiment]
[Configuration]

FIG. 1 perspectively illustrates an example of a schematic configuration of a display unit 1 according to a first embodiment of the present technology. The display unit 1 of the first embodiment is referred to as so-called LED display, and includes LED as a display pixel. For example, as illustrated in FIG. 1, the display unit 1 may include a display panel 10, and a drive circuit 20 driving the display panel 10 (specifically, a light emitting element 46 described later).

(Display Panel 10)

The display panel 10 is configured of a mounting board 10A and a counter substrate 10B stacked on each other. A surface of the counter substrate 10B serves as an image display surface that has a display region in a central section, and a frame region as a non-display region in the periphery of the display region.

Figure 2:
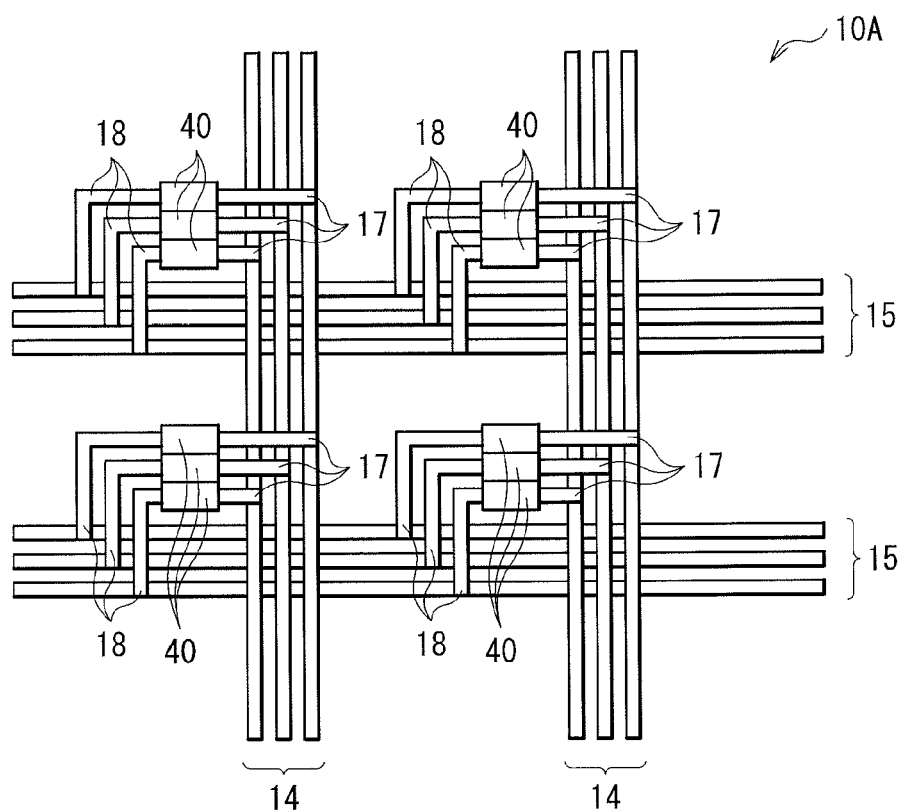
FIG. 2 is a plan diagram illustrating an exemplary layout of a surface of a mounting board illustrated in FIG. 1.
Figure 3:
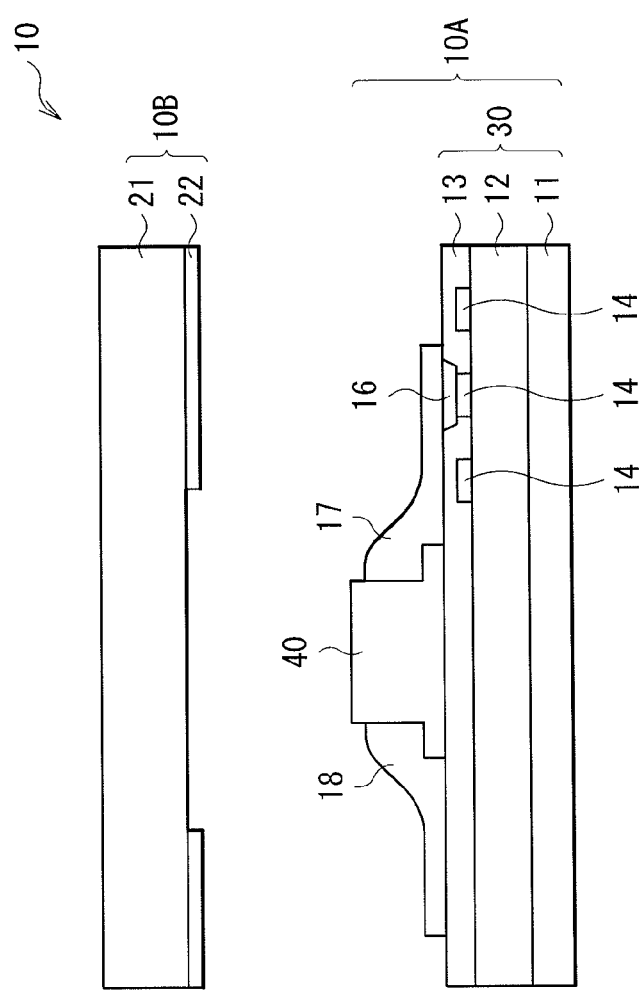
FIG. 3 is a cross-sectional diagram illustrating an exemplary configuration of a cut surface across a light emitting unit in the display unit illustrated in FIG. 1.

FIG. 2 illustrates an exemplary layout of a region, which corresponds to the display region, of a surface on a side close to the counter substrate 10B of the mounting board 10A. FIG. 3 illustrates an exemplary sectional configuration of a section across a light emitting unit 40 described later in the display unit 1 illustrated in FIG. 1.

(Mounting Board 10A)

The mounting board 10A has a surface including a region corresponding to the display region, and, for example, may have a plurality of Y lines 14 corresponding to data lines and a plurality of X lines 15 corresponding to scan lines in the region, as illustrated in FIG. 2. The plurality of Y lines 14 are provided extending in a predetermined direction (column direction in the drawing), and are arranged in parallel at predetermined pitches. The plurality of X lines 15 are provided extending in a direction (row direction in the drawing) intersecting with (for example, orthogonal to) the Y lines 14, and are arranged in parallel at predetermined pitches. The Y lines 14 and the X lines 15 may each be configured of a conductive material such as, for example, copper (Cu).

The mounting board 10A has a plurality of light emitting units 40 corresponding to display pixels. For example, one or more (three in the drawing) of the light emitting units 40 may be disposed in each of regions near crossing sites of the Y lines 14 and the X lines 15. In other words, the plurality of light emitting units 40 are arranged in a matrix within the display region. Each of the light emitting units 40 is electrically connected to the Y lines 14 through conductive junctions 17, and electrically connected to the X lines 15 through conductive junctions 18. In the case where three light emitting units 40 are provided in each of regions near crossing sites of the Y lines 14 and the X lines 15, a first light emitting unit 40 may include a light emitting element 46R that emits red light as a light emitting element 46 described later, for example. A second light emitting unit 40 may include a light emitting element 46G that emits green light as the light emitting element 46 described later, for example. A third light emitting unit 40 may include a light emitting element 46B that emits blue light as the light emitting element 46 described later, for example. It is to be noted that the internal configuration of the light emitting unit 40 will be described in detail later.

For example, as illustrated in FIG. 3, the mounting board 10A may include the wiring substrate 30 on which the plurality of light emitting units 40 are mounted. The wiring substrate 30 may be configured of, for example, a support substrate 11, and an interlayer insulating film 12 and an interlayer insulating film 13 stacked in this order on the support substrate 11. Examples of the support substrate 11 include a glass substrate and a resin substrate. The interlayer insulating film 12 and the interlayer insulating film 13 may each be configured of, for example, SiN, $SiO_2$, or $Al_2O_3$. The interlayer insulating film 13 is a layer configuring the uppermost surface of the support substrate 11. For example, the Y lines 14 may be provided in the same layer as the interlayer insulating film 13 as the uppermost layer. In such a configuration, the Y line 14 is electrically connected to a junction 17 through a conductive junction 16 provided in the same layer as the interlayer insulating film 13. On the other hand, for example, the X lines 15 may be provided in a layer between the support substrate 11 and the interlayer insulating film 13, and, for example, may be provided in the interlayer insulating film 12. In such a configuration, the X line 15 is electrically connected to a junction 18 through a conductive junction (not shown) provided in the same layer as the interlayer insulating films 12 and 13.

(Counter Substrate 10B)

For example, as illustrated in FIG. 3, the counter substrate 10B may include a transparent substrate 21, and a black matrix 22 provided on a side close to the mounting board 10A of the transparent substrate 21. Examples of the transparent substrate 21 include a glass substrate and a transparent resin substrate.

Figure 4:
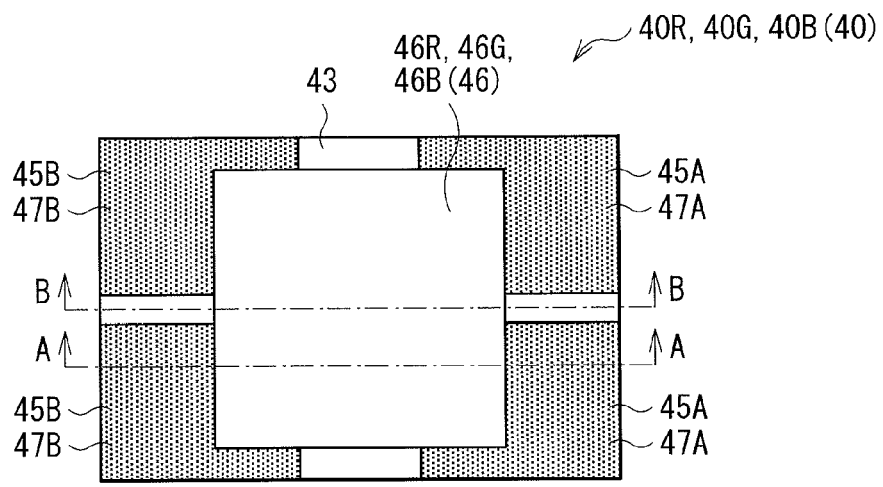
FIG. 4 is a plan diagram illustrating an exemplary top configuration of the light emitting unit illustrated in FIG. 3.
Figure 5A:
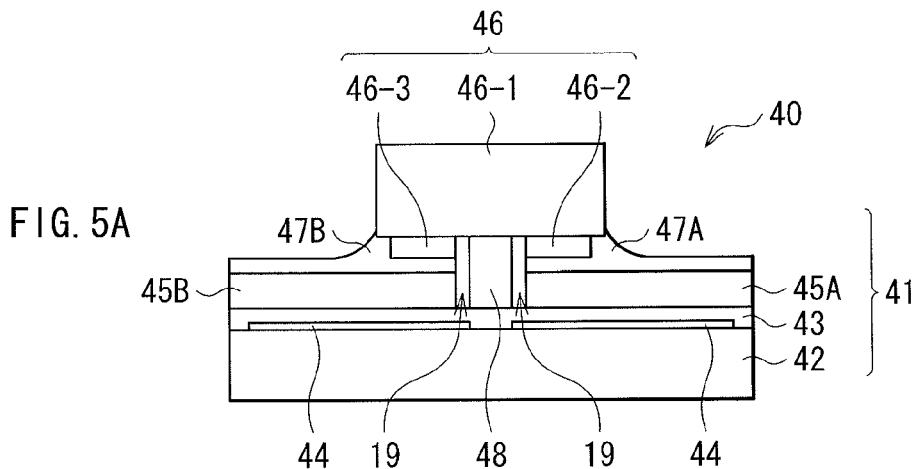
FIGS. 5A and 5B are cross-sectional diagrams illustrating exemplary sectional configurations along A-A and B-B arrow directions, respectively, of the light emitting unit illustrated in FIG. 4.
Figure 5B:
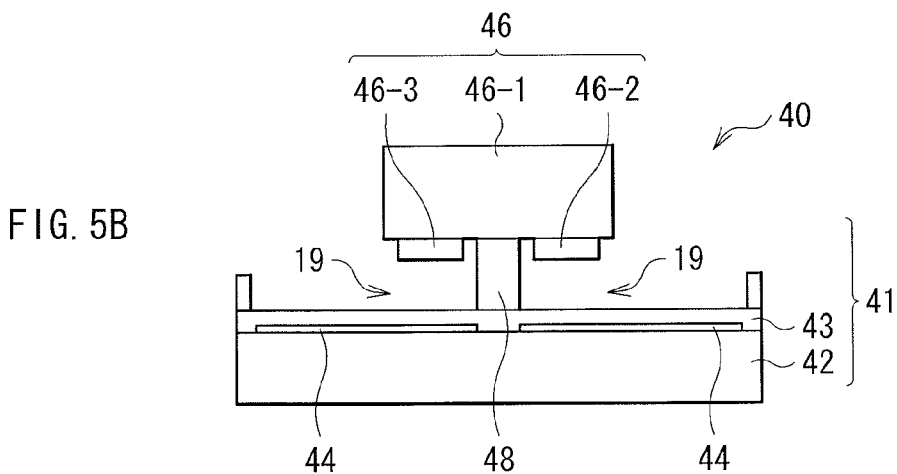
Figure 6:
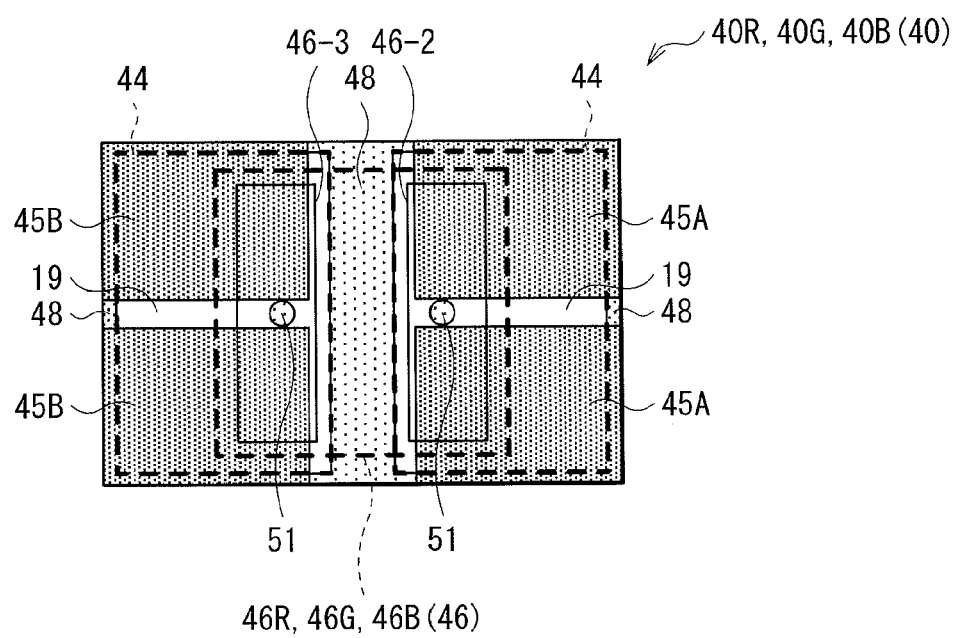
FIG. 6 is a plan diagram illustrating an exemplary in-plane layout of an electrode pad of the light emitting unit illustrated in FIGS. 5A and 5B.

The internal configuration of the light emitting unit 40 is now described. FIG. 4 illustrates an exemplary top configuration of the light emitting unit 40. FIG. 5A illustrates an exemplary sectional configuration along an A-A arrow direction of the light emitting unit 40 illustrated in FIG. 4. FIG. 5B illustrates an exemplary sectional configuration along a B-B arrow direction of the light emitting unit 40 illustrated in FIG. 4. FIG. 6 illustrates an exemplary in-plane layout of electrode pads 45A and 45B described later of the light emitting unit 40 illustrated in FIG. 4.

The light emitting unit 40 includes an element substrate 41 and a light emitting element 46 (functional element) mounted on the element substrate 41. The light emitting element 46 may be, for example, an LED chip. For example, the light emitting element 46 may include a semiconductor layer 46-1 including a stacked structure where an active layer is sandwiched by semiconductor layers having different conduction types, and two electrodes 46-2 and 46-3 disposed on a common surface (the same surface) of the semiconductor layer 46-1. The electrode 46-2 is electrically connected to a first semiconductor sub-layer having a first conduction type in the semiconductor layer 46-1, while the electrode 46-3 is electrically connected to a second semiconductor sub-layer having a second conduction type therein.

For example, the element substrate 41 may include a support substrate 42, and may include a light shielding film 44, an insulating layer 43, and two electrode pads 45A as well as two electrode pads 45B stacked in this order on the support substrate 42. An electrode including the two electrode pads 45A and an electrode including the two electrode pads 45B are disposed to be opposed to each other on the same surface with a predetermined gap therebetween. It is to be noted that the individual electrode pad 45A corresponds to a specific example of the "divided seed metal" of the present technology, and the electrode including the two electrode pads 45A corresponds to a specific example of the "first seed metal" of the present technology. The electrode including the two electrode pads 45B corresponds to a specific example of the "second seed metal" of the present technology.

Examples of the support substrate 42 include a silicon substrate and a resin substrate. The insulating layer 43 is to form a flat surface on which the electrode pads 45A and 45B are to be formed, and may be configured of, for example, SiN, $SiO_2$, or $Al_2O_3$. The electrode pads 45A and 45B serve as power feeding layers in electrolytic plating, and serve as electrode pads on which the light emitting element 46 is to be mounted The light emitting element 46 is mounted on the electrode pads 45A and 45B. Specifically, one electrode 46-2 of the light emitting element 46 is connected to the electrode pads 45A through a plated metal 47A, and the other electrode 46-3 of the light emitting element 46 is connected to the electrode pads 45B through a plated metal 47B. In other words, the two electrode pads 45A are disposed in a section opposed to part or all of the electrode 46-2, and are connected to the electrode 46-2 by plating. The two electrode pads 45B are disposed in a section opposed to part or all of the electrode 46-3, and are connected to the electrode 46-3 by plating. The electrode pads 45A and the electrode pads 45B are disposed to be opposed to each other in the same direction as an opposed direction of the electrode 46-2 and the electrode 46-3.

If the electrode 46-2 has a recess 51 for some reason, the two electrode pads 45A are provided avoiding part or all of a section opposed to the recess 51. Specifically, the two electrode pads 45A are preferably disposed to be opposed to each other with a section opposed to the recess 51 therebetween. Similarly, if the electrode 46-3 has a recess 51 for some reason, the two electrode pads 45B are preferably disposed to be opposed to each other with a section opposed to the recess 51 therebetween. It is to be noted that the recess 51 may be, for example, a via hole provided for electrical connection of the electrode 46-2 (or electrode 46-3) to the semiconductor layer 46-1.

The element substrate 41 further includes a resin component 48 in a layer between the light emitting element 46 and the support substrate 42. The resin component 48 is to fix the light emitting element 46 to the support substrate 42, and may be formed, for example, by curing an ultraviolet curable resin. The resin component 48 supports the light emitting element 46 above the support substrate 42 (i.e., in the air) during electrolytic plating to provide a gap between the electrode 46-2 and the electrode pad 45A, and between the electrode 46-3 and the electrode pad 45B.

The resin component 48 is provided avoiding the neighborhood of an end of the light emitting element 46 among the opposed side sections of the electrode pads 45A and 45B (or the electrode including the two electrode pads 45A and the electrode including the two electrode pads 45B). Specifically, the resin component 48 is provided avoiding the opposed side sections of the electrode pads 45A and 45B. As a result, the element substrate 41 has a passage 19 that extends along the opposed side sections of the electrode pads 45A and 45B, and runs through a region between the light emitting element 46 and the support substrate 42. As illustrated in FIG. 6, the passage 19 is provided along the side sections of the electrode pads 45A or the electrode pads 45B, and thus has a T shape. Since the electrode pads 45A and 45B are provided avoiding part or all of the section opposed to the recess 51 as described above, the passage 19 is in communication with the recess 51. Hence, even if a plating solution stays in the recess 51 during electrolytic plating, the plating solution is discharged to the outside through the passage 19, and thus does not remain in the recess 51.

The above-described passage 19 may be formed using the above-described light shielding film 44. The light shielding film 44 is disposed in a layer between the support substrate 42 and the electrode pads 45A and 45B. Specifically, the light shielding film 44 is provided in a section that is not opposed to the resin component 48, but is opposed to a section in which the passage 19 is to be formed. For example, as illustrated in FIG. 6, one light shielding film 44 may be provided in a section including a region opposed to the electrode 46-2, and the other light shielding film 44 may be provided in a section including a region opposed to the electrode 46-3. In this configuration, for example, the two light shielding films 44 may not be in contact with each other, and may be disposed to be opposed to each other on the same surface with a predetermined gap therebetween.

Incidentally, the two light shielding films 44 may be in contact with each other into one light shielding film (not shown). In such a case, however, it is sufficient that the light shielding film has an opening in part or all of a region between the electrode pads 45A and the electrode pads 45B, and the resin component 48 is provided in correspondence to the opening.

[Manufacturing Method]

An exemplary method of manufacturing the light emitting unit 40 is now described. First, the light shielding film 44 is formed on the support substrate 42 in a section that is not opposed to the resin component 48, but is opposed to a section in which the passage 19 is to be formed. Then, the light shielding film 44 is covered by the insulating film 43 to form a flat surface, and the electrode pads 45A and 45B are formed on the flat surface. Subsequently, a photosensitive resin is applied onto the entire surface, and then the light emitting element 46 is mounted directly above the electrode pads 45A and 45B. Subsequently, ultraviolet rays are applied to the photosensitive resin through the support substrate 42 while being shielded by the light shielding film 44 and the electrode pads 45A and 45B. As a result, the photosensitive resin is cured, and the resin component 48 is formed avoiding the neighborhood of an end of the light emitting element 46 among the opposed side sections of the electrode pads 45A and 45B. In this way, the light emitting unit 40 is manufactured.

[Functions and Effects]

Figure 7:
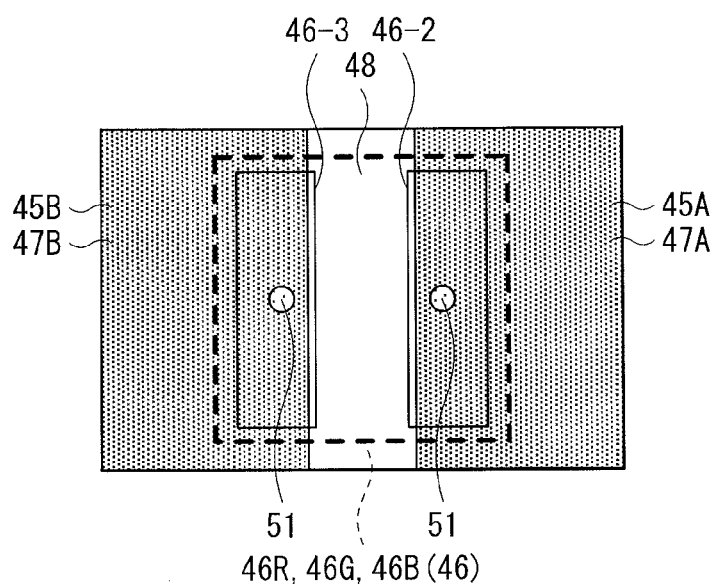
FIG. 7 is a plan diagram illustrating an exemplary in-plane layout of an electrode pad of a light emitting unit according to a comparative example.
Figure 8A:
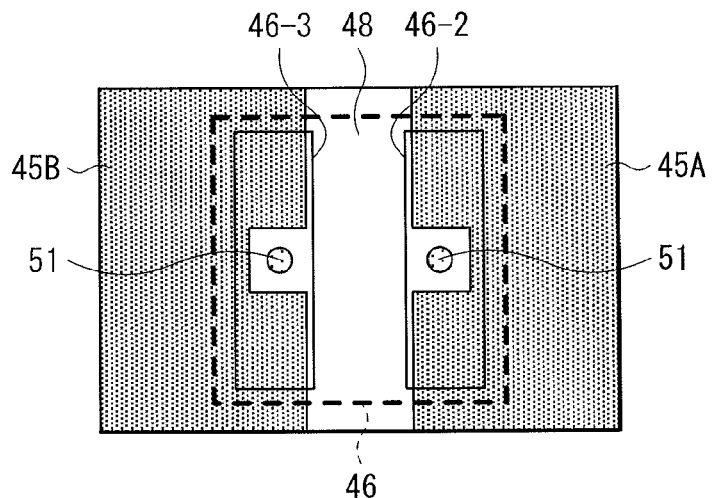
FIGS. 8A to 8C are plan diagrams illustrating other exemplary in-plane layouts of the electrode pad of the light emitting unit according to the comparative example.
Figure 8B:
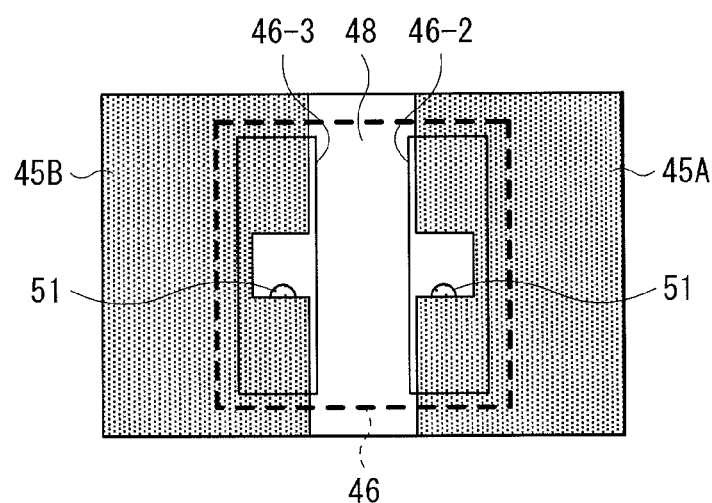
Figure 8C:
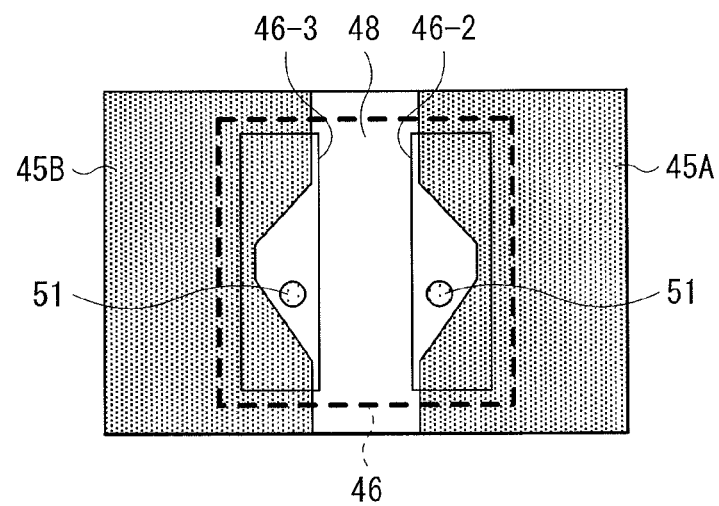

The functions and effects of the display unit 1 are now described in comparison with a comparative example illustrated in FIGS. 7 to 8C. FIG. 7 illustrates an exemplary in-plane layout including the electrode pads 45A and 45B of a light emitting unit according to a comparative example. FIGS. 8A to 8C illustrate other exemplary in-plane layouts each including the electrode pads 45A and 45B of the light emitting unit according to the comparative example.

In the layout of FIG. 7, respective recesses 51 are closed by plated metals 47A and 47B. Hence, if a plating solution stays in the recess 51 during electrolytic plating, the plating solution is likely to remain in the recess 51. In the layout of FIG. 8A, each of the electrode pads 45A and 45B has a cutout, so that the respective recesses 51 are not closed by the plated metals 47A and 47B. However, the plating solution is likely to remain in an acute-angled section in each of the cutouts of the electrode pads 45A and 45B. In the layout of FIG. 8B, when the light emitting element 46 is mounted directly above the electrode pads 45A and 45B, the light emitting element 46 may be displaced, so that the recesses 51 partially overlap with the respective electrode pads 45A and 45B in some case. In such a case, the plating solution is likely to remain in a section where the respective recesses 51 are opposed to the electrode pads 45A and 45B. In the layout of FIG. 8C, even if the light emitting element 46 is displaced, the recess 51 does not overlap with the electrode pad 45A or 45B. In this case, however, it is necessary for each of the electrode pads 45A and 45B to have a large cutout. Hence, a light emitting element 46 that has a small size or shows high current density is difficult to have such a configuration. In addition, area of the connected region between the light emitting element 46 and the electrode pad 45A or 45B is difficult to be adjusted within a desired range; hence, high positional accuracy is necessary for mounting.

In contrast, in this embodiment, the electrode pads 45A and 45B are connected by plating to the electrodes 46-2 and 46-3, respectively, of the light emitting element 46. Furthermore, the resin component 48, which fixes the light emitting element 46 to the element substrate 41, is provided avoiding the neighborhood of an end of the light emitting element 46 among the opposed side sections of the electrode pads 45A and 45B. Thus, when connecting operation is performed by plating in a manufacturing process, the plating solution is discharged to the outside from a region between the light emitting element 46 and the element substrate 41 through a region having no resin component 48. As a result, the plating solution less remains in the region between the light emitting element 46 and the element substrate 41.

[3. Modifications of First Embodiment]

[Modification 1]

In the first embodiment, the electrode pads 45A and 45B and the electrodes 46-2 and 46-3 each have a square shape, and the electrode pads 45A and 45B are disposed to have respective one sides opposed to each other. However, for example, the electrode pads 45A and 45B and the electrodes 46-2 and 46-3 may each have a right-angled triangle shape, and furthermore the electrode pads 45A and 45B may be disposed to have respective hypotenuses opposed to each other.

Figure 9:
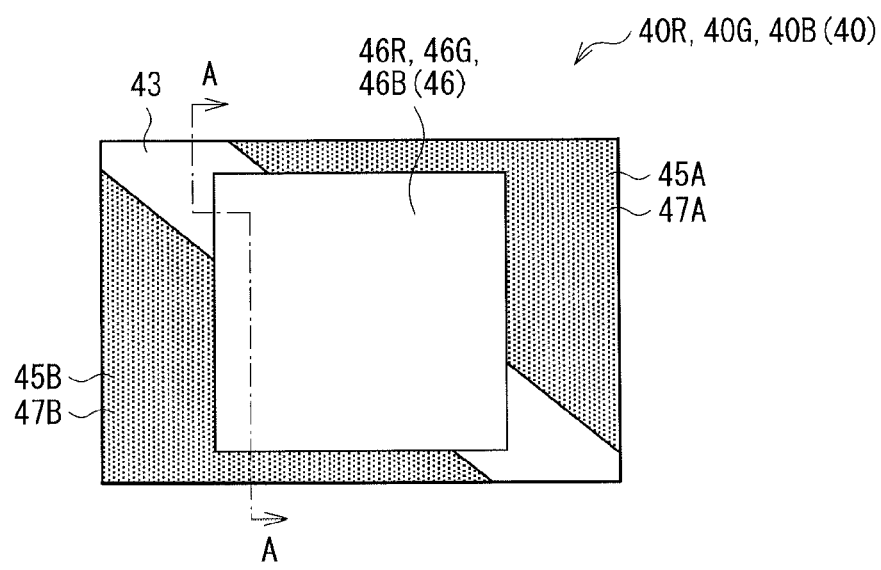
FIG. 9 is a plan diagram illustrating an exemplary top configuration of a light emitting unit according to Modification 1.
Figure 10:
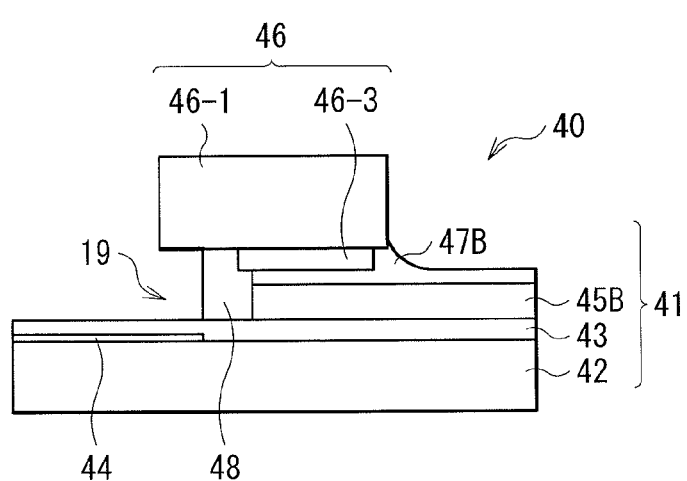
FIG. 10 is a cross-sectional diagram illustrating an exemplary sectional configuration along an A-A arrow direction of the light emitting unit illustrated in FIG. 9.
Figure 11:
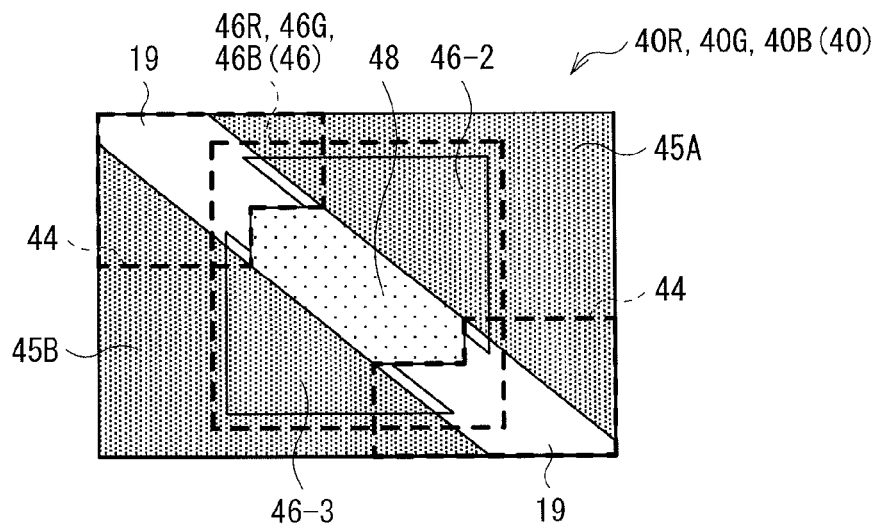
FIG. 11 is a plan diagram illustrating an exemplary in-plane layout of an electrode pad of the light emitting unit illustrated in FIG. 10.

FIG. 9 illustrates an exemplary top configuration of the light emitting unit 40 according to the Modification 1. FIG. 10 illustrates an exemplary sectional configuration along an A-A arrow direction of the light emitting unit 40 illustrated in FIG. 9. FIG. 11 illustrates an exemplary layout of a surface including the electrode pads 45A and 45B of the light emitting unit 40 illustrated in FIG. 10. In the Modification 1, the electrode pads 45A and 45B and the electrodes 46-2 and 46-3 each have a right-angled triangle shape, and the electrode pads 45A and 45B are disposed to have respective hypotenuses opposed to each other.

In the Modification 1, the resin component 48 is also provided avoiding the neighborhood of an end of the light emitting element 46 among the opposed side sections of the electrode pads 45A and 45B. Specifically, the resin component 48 is provided avoiding a section that is opposed to a region between the electrode pads 45A and the electrode pads 45B, but is not opposed to the light emitting element 46, and avoiding the neighborhood of the section. Moreover, the resin component 48 is provided avoiding a section opposed to a region between the electrode pad 45A and the electrode pad 45B, but is not opposed to the light emitting element 46, and avoiding the neighborhood of the section. The resin component 48 is provided only directly below the light emitting element 46.

Figure 12A:
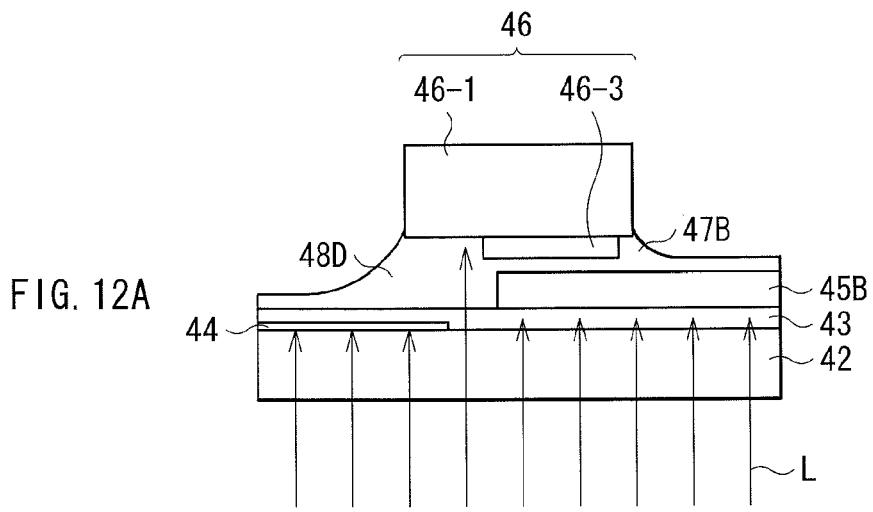
FIGS. 12A and 12B are cross-sectional diagrams for explaining an exemplary manufacturing process of the light emitting unit illustrated in FIG. 9.
Figure 12B:
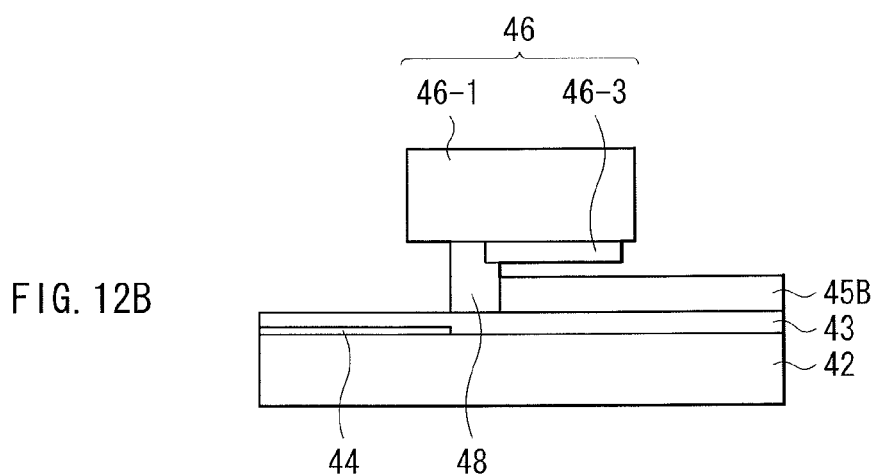

Hence, even if a plating solution stays in the region between the light emitting element 46 and the support substrate 42 during electrolytic plating, the plating solution is discharged to the outside through the passage 19, and thus does not remain in the region between the light emitting element 46 and the support substrate 42. Moreover, for example, as illustrated in FIG. 12A, when ultraviolet rays L are applied to a photosensitive resin 48D through the support substrate 42 while being shielded by the light shielding film 44 and the electrode pads 45A and 45B in a manufacturing process, the ultraviolet rays L do not impinge on any fillet of the photosensitive resin 48D, and thus are not reflected by the fillet. As a result, for example, as illustrated in FIG. 12B, formation of the resin component 48 is reduced in the region between the electrode 46-2 and the electrode pad 45A, and in the region between the electrode 46-3 and the electrode pad 45B.

The above-described passage 19 may be formed using the light shielding film 44. In the Modification 1, the light shielding film 44 is disposed in a layer between the support substrate 42 and each of the electrode pads 45A and 45B. Specifically, the light shielding film 44 is provided in a section that is not opposed to the resin component 48, but is opposed to a section in which the passage 19 is to be formed. For example, as illustrated in FIG. 11, the respective light shielding films 44 may be provided over the two sections that are opposed to the region between the electrode pads 45A and the electrode pads 45B, but are not opposed to the light emitting element 46, and over the neighborhoods of the sections. In this configuration, for example, the two light shielding films 44 may not be in contact with each other, and may be disposed to be opposed to each other on the same surface with a predetermined gap therebetween.

The two light shielding films 44 may be in contact with each other into one light shielding film (not shown). In such a case, however, the light shielding film 44 may have an opening in part or all of a region between the electrode pad 45A and the electrode pad 45B, and the resin component 48 may be provided in correspondence to the opening.

An exemplary method of manufacturing the light emitting unit 40 is now described. First, the light shielding film 44 is formed on the support substrate 42 in a section that is not opposed to the resin component 48, but is opposed to a section in which the passage 19 is to be formed. Then, the light shielding film 44 is covered by the insulating film 43 to form a flat surface, and the electrode pads 45A and 45B are formed on the flat surface. Subsequently, a photosensitive resin 48D is applied onto the entire surface, and then the light emitting element 46 is mounted directly above the electrode pads 45A and 45B. Subsequently, ultraviolet rays L are applied to the photosensitive resin 48D through the support substrate 42 while being shielded by the light shielding film 44 and the electrode pads 45A and 45B. As a result, the photosensitive resin 48D is cured, and the resin component 48 is formed avoiding the neighborhood of an end of the light emitting element 46 among the opposed side sections of the electrode pads 45A and 45B.

Figure 13A:
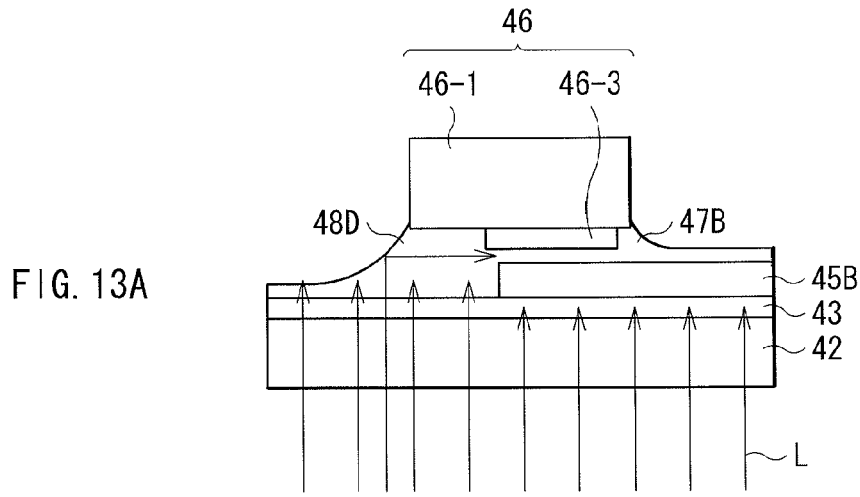
FIGS. 13A and 13B are cross-sectional diagrams for explaining an exemplary manufacturing process of the light emitting unit according to the comparative example.
Figure 13B:
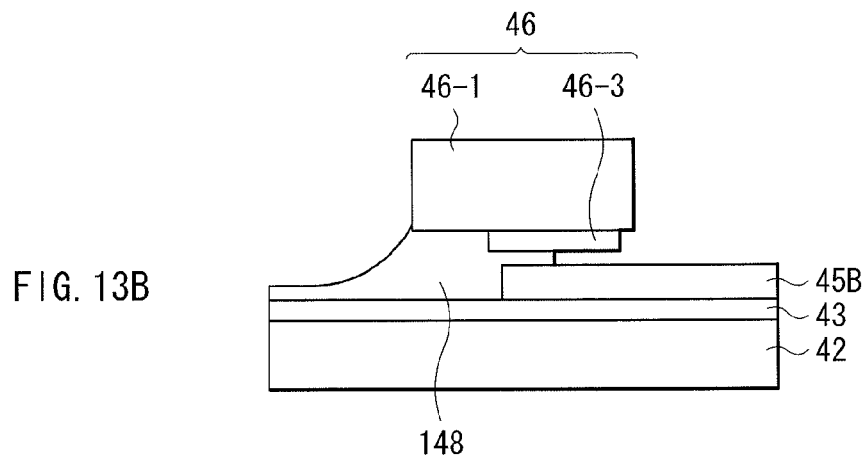

The functions and effects of the display unit 1 according to the Modification 1 are now described in comparison with a comparative example. FIGS. 13A and 13B illustrate an exemplary manufacturing process of a light emitting unit according to the comparative example.

In FIG. 13A, ultraviolet rays L are applied to the photosensitive resin 48D through the support substrate 42 while being shielded by the electrode pads 45A and 45B. During this operation, the ultraviolet rays L impinge on a fillet of the photosensitive resin 48D. As a result, the ultraviolet rays L are reflected by the fillet, and the reflected light impinges on the photosensitive resin 48D in the region between the electrode 46-2 and the electrode pad 45A and in the region between the electrode 46-3 and the electrode pad 45B. As a result, as illustrated in FIG. 13B, the photosensitive resin 48D is cured in the region between the electrode 46-2 and the electrode pad 45A and in the region between the electrode 46-3 and the electrode pad 45B, and thus inferior connection may occur between the electrode 46-2 and the electrode pad 45A or between the electrode 46-3 and the electrode pad 45B.

In contrast, in the Modification 1, the electrode pads 45A and 45B are connected by plating to the electrodes 46-2 and 46-3, respectively, of the light emitting element 46. Furthermore, the resin component 48, which fixes the light emitting element 46 to the element substrate 41, is provided avoiding the neighborhood of an end of the light emitting element 46 among the opposed side sections of the electrode pads 45A and 45B. Thus, when connecting operation is performed by plating in a manufacturing process, the plating solution is discharged to the outside from the region between the light emitting element 46 and the element substrate 41 through a region having no resin component 48. In addition, inferior connection by plating less occurs between the electrode 46-2 and the electrode pad 45A, and between the electrode 46-3 and the electrode pad 45B.

[Modification 2]

In the Modification 1, the electrode pads 45A and 45B and the electrodes 46-2 and 46-3 each have a right-angled triangle shape, and the electrode pads 45A and 45B are disposed to have respective hypotenuses opposed to each other. In the Modification 1, however, the electrode pads 45A and 45B and the electrodes 46-2 and 46-3 may each have a square shape, and furthermore the electrode pads 45A and 45B may be disposed to have respective one sides opposed to each other. Specifically, the electrode pads 45A and 45B and the electrodes 46-2 and 46-3 may each have a square shape, and the electrode pads 45A and 45B may be disposed to have respective one sides opposed to each other, and furthermore the resin component 48 may be provided only directly below the light emitting element 46.

Figure 14:
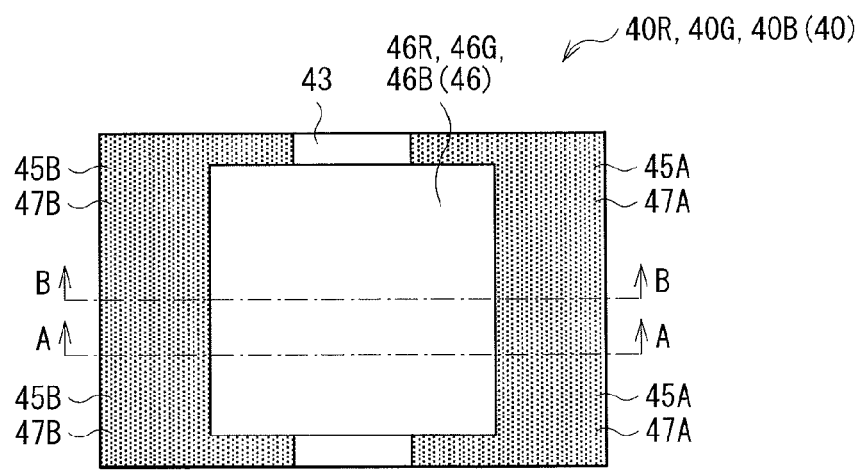
FIG. 14 is a plan diagram illustrating an exemplary top configuration of a light emitting unit according to Modification 2.
Figure 15A:
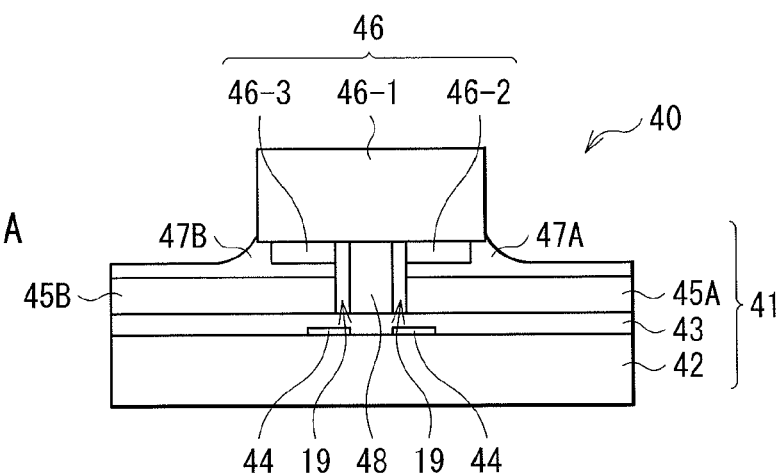
FIGS. 15A and 15B are cross-sectional diagrams illustrating exemplary sectional configurations along A-A and B-B arrow directions, respectively, of the light emitting unit illustrated in FIG. 14.
Figure 15B:
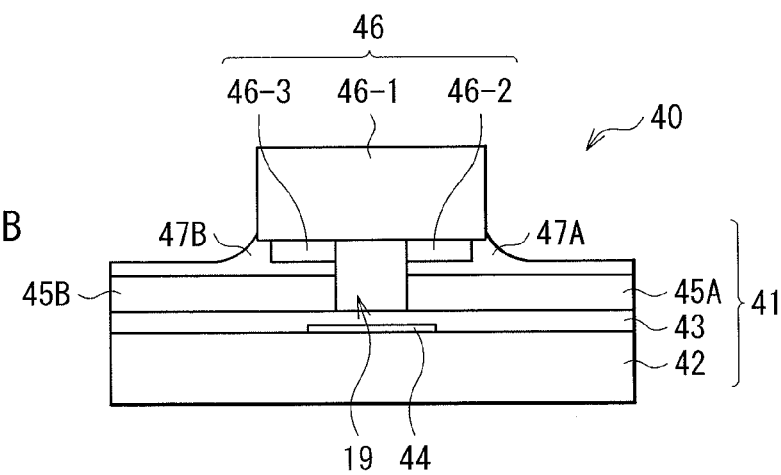
Figure 16A:
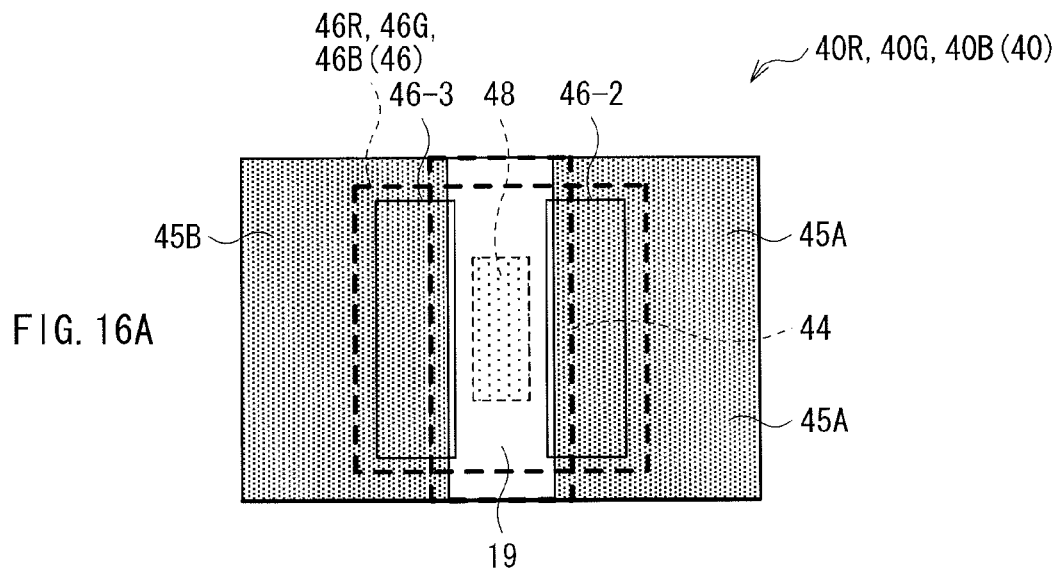
FIGS. 16A and 16B are plan diagrams illustrating an exemplary in-plane layout of an electrode pad of the light emitting unit illustrated in FIGS. 15A and 15B.
Figure 16B:
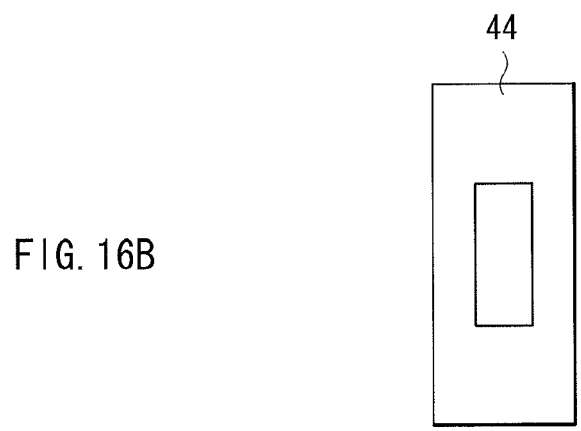

FIG. 14 illustrates an exemplary top configuration of the light emitting unit 40 according to the Modification 2. FIG. 15A illustrates an exemplary sectional configuration along an B-B arrow direction of the light emitting unit 40 illustrated in FIG. 14. FIG. 15B illustrates an exemplary sectional configuration along a A-A arrow direction of the light emitting unit 40 illustrated in FIG. 14. FIG. 16A illustrates an exemplary layout of a surface including the electrode pads 45A and 45B of the light emitting unit 40 illustrated in FIG. 15A. FIG. 16B illustrates an exemplary configuration of the light shielding film 44 in the Modification 2. In the Modification 2, the electrode pads 45A and 45B and the electrodes 46-2 and 46-3 each have a square shape, and the electrode pads 45A and 45B are disposed to have respective one sides opposed to each other.

In the Modification 2, the resin component 48 is also provided avoiding the neighborhood of an end of the light emitting element 46 among the opposed side sections of the electrode pads 45A and 45B. Specifically, the resin component 48 is provided avoiding the opposed side sections of the electrode pads 45A and 45B. As a result, the element substrate 41 has a passage 19 that extends along the opposed side sections of the electrode pads 45A and 45B, and runs through the region between the light emitting element 46 and the support substrate 42. As illustrated in FIGS. 15A, 15B, and 16A, the passage 19 is provided along the side sections of the electrode pad 45A or 45B. Furthermore, the resin component 48 is provided in only part of a region opposed to the light emitting element 46, i.e., only directly below the light emitting element 46. As a result, the passage 19 has an O shape. Hence, even if the plating solution stays in the region between the light emitting element 46 and the support substrate 42 during electrolytic plating, the plating solution is discharged to the outside through the passage 19, and thus does not remain in the region between the light emitting element 46 and the support substrate 42.

The above-described passage 19 may be formed using the light shielding film 44. The light shielding film 44 is disposed in a layer between the support substrate 42 and each of the electrode pads 45A and 45B. Specifically, the light shielding film 44 is provided in a section that is not opposed to the resin component 48, but is opposed to a section in which the passage 19 is to be formed. For example, as illustrated in FIG. 16A, the light shielding film 44 may be provided covering opposed side sections of the electrode pads 45A and 45B, and covering a region between the electrode pads 45A and 45B, the region being not opposed to the light emitting element 46, and covering the neighborhood of the region. Specifically, the light shielding film 44 has an O shape, as illustrated in FIG. 16B.

An exemplary method of manufacturing the light emitting unit 40 is now described. First, the light shielding film 44 is formed on the support substrate 42 in a section that is not opposed to the resin component 48, but is opposed to a section in which the passage 19 is to be formed. Then, the light shielding film 44 is covered by the insulating film 43 to form a flat surface, and the electrode pads 45A and 45B are formed on the flat surface. Subsequently, a photosensitive resin is applied onto the entire surface, and then the light emitting element 46 is mounted directly above the electrode pads 45A and 45B. Subsequently, ultraviolet rays are applied to the photosensitive resin through the support substrate 42 while being shielded by the light shielding film 44 and the electrode pads 45A and 45B. As a result, the photosensitive resin is cured, and the resin component 48 is formed avoiding the neighborhood of an end of the light emitting element 46 among the opposed side sections of the electrode pads 45A and 45B.

The functions and effects of the display unit 1 according to the Modification 2 are now described. In the Modification 2, the electrode pads 45A and 45B are connected by plating to the electrodes 46-2 and 46-3, respectively, of the light emitting element 46. Furthermore, the resin component 48, which fixes the light emitting element 46 to the element substrate 41, is provided avoiding the neighborhood of an end of the light emitting element 46 among the opposed side sections of the electrode pads 45A and 45B. Thus, when connecting operation is performed by plating in a manufacturing process, the plating solution is discharged to the outside from the region between the light emitting element 46 and the element substrate 41 through a region having no resin component 48. As a result, the plating solution less remains in the region between the light emitting element 46 and the element substrate 41. Furthermore, in the Modification 2, the resin component 48 is provided only in a section opposed to the light emitting element 46, i.e., directly below the light emitting element 46. Thus, light emitted by the light emitting element 46 does not directly enter the resin component 48, which reduces degradation in resin component 48 due to the light emitted from the light emitting element 46.

[Modification 3]

Figure 17:
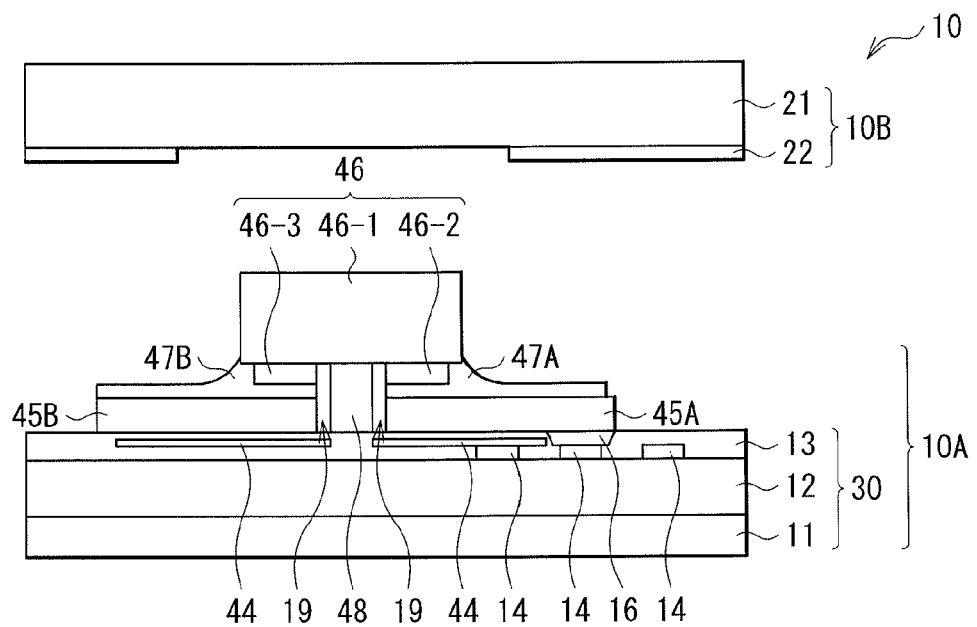
FIG. 17 is a cross-sectional diagram illustrating an exemplary sectional configuration of a structure including a light emitting element that is directly mounted on a wiring substrate in a configuration similar to that illustrated in FIGS. 4 to 6.

In the above-described embodiment, for example, as illustrated in FIG. 17, the light emitting element 46 may be directly mounted on the wiring substrate 30 in a configuration similar to that illustrated in FIGS. 4 to 6. In other words, the light shielding film 44 and the electrode pads 45A and 45B may be provided on the wiring substrate 30, and furthermore the light emitting element 46 may be connected by plating to the electrode pads 45A and 45B provided on the wiring substrate 30 in a configuration similar to that illustrated in FIGS. 4 to 6. The resin component 48 and the light shielding film 44 are similar to those in the above-described first embodiment.

[Modification 4]

Figure 18:
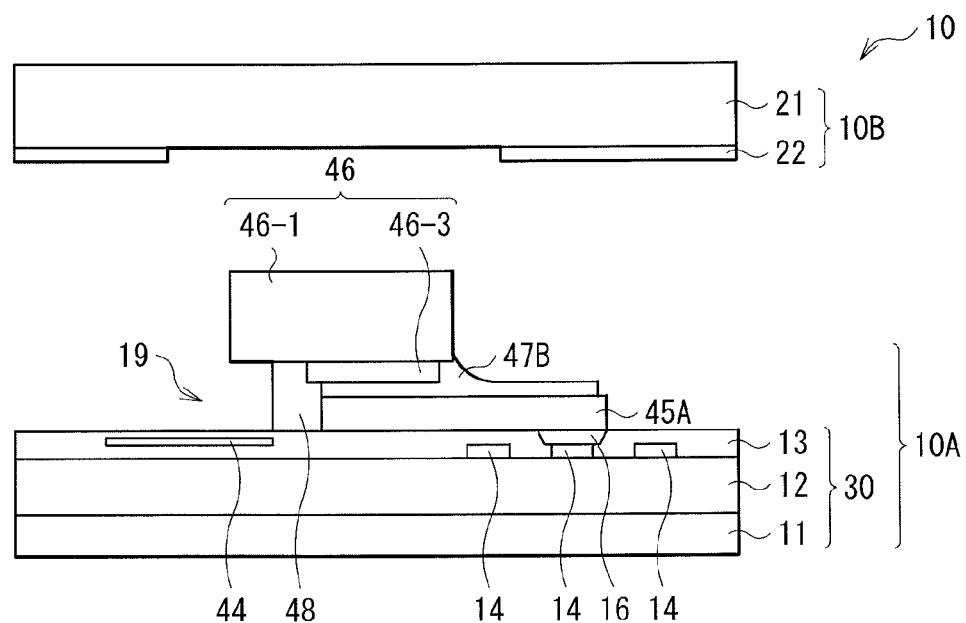
FIG. 18 is a cross-sectional diagram illustrating an exemplary sectional configuration of a structure including a light emitting element that is directly mounted on a wiring substrate in a configuration similar to that illustrated in FIGS. 9 to 11.

In the Modification 1, for example, as illustrated in FIG. 18, the light emitting element 46 may be directly mounted on the wiring substrate 30 in a configuration similar to that illustrated in FIGS. 9 to 11. In other words, the light shielding film 44 and the electrode pads 45A and 45B may be provided on the wiring substrate 30, and furthermore the light emitting element 46 may be connected by plating to the electrode pads 45A and 45B provided on the wiring substrate 30 in a configuration similar to that illustrated in FIGS. 9 to 11. The resin component 48 and the light shielding film 44 are similar to those in the Modification 1.

[Modification 5]

Figure 19:
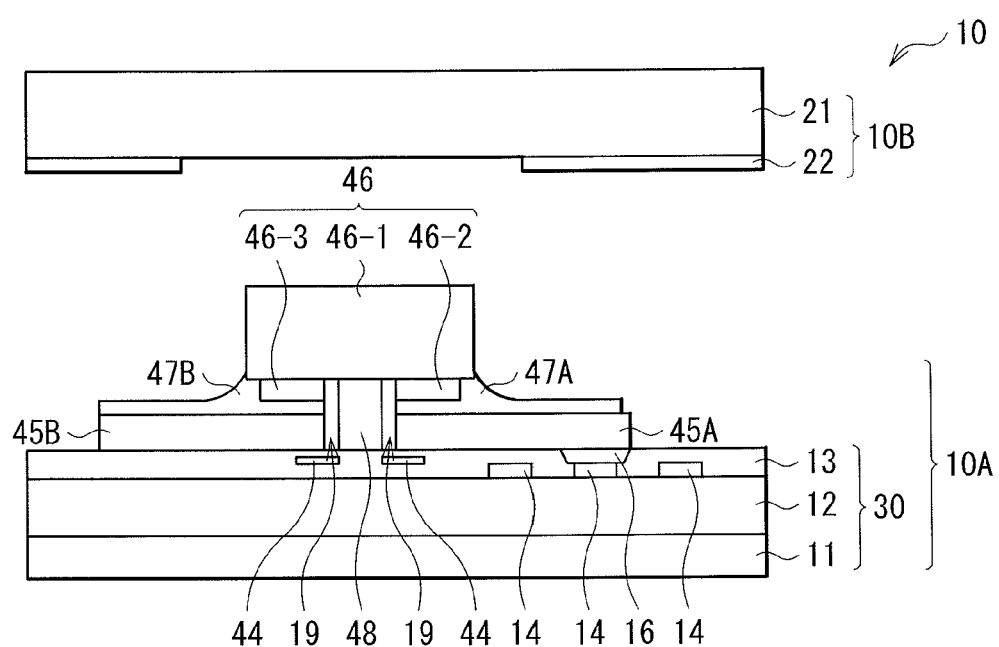
FIG. 19 is a cross-sectional diagram illustrating an exemplary sectional configuration of a structure including a light emitting element that is directly mounted on a wiring substrate in a configuration similar to that illustrated in FIGS. 14 to 16B.

In the Modification 2, for example, as illustrated in FIG. 19, the light emitting element 46 may be directly mounted on the wiring substrate 30 in a configuration similar to that illustrated in FIGS. 14 to 16B. In other words, the light shielding film 44 and the electrode pads 45A and 45B may be provided on the wiring substrate 30, and furthermore the light emitting element 46 is connected by plating to the electrode pads 45A and 45B provided on the wiring substrate 30 in a configuration similar to that illustrated in FIGS. 14 to 16B. The resin component 48 and the light shielding film 44 are similar to those in the Modification 2.

[4. Second Embodiment]

Figure 20:
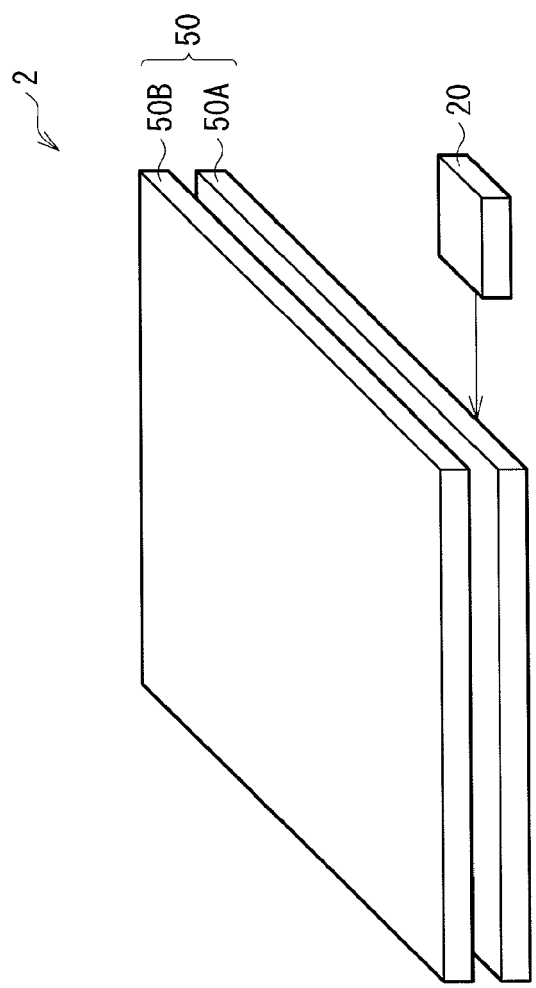
FIG. 20 is a perspective diagram illustrating an exemplary image pickup unit according to a second embodiment of the technology.

FIG. 20 perspectively illustrates an example of a schematic configuration of an image pickup unit 2 according to a second embodiment of the present technology. The image pickup unit 2 of the second embodiment includes a large number of light receiving elements (for example, photo diode (PD)) two-dimensionally arranged. For example, as illustrated in FIG. 20, the image pickup unit 2 may include an image pickup panel 50, and a drive circuit 20 driving the image pickup panel 50 (specifically, a light receiving element 61 described later).

Figure 21:
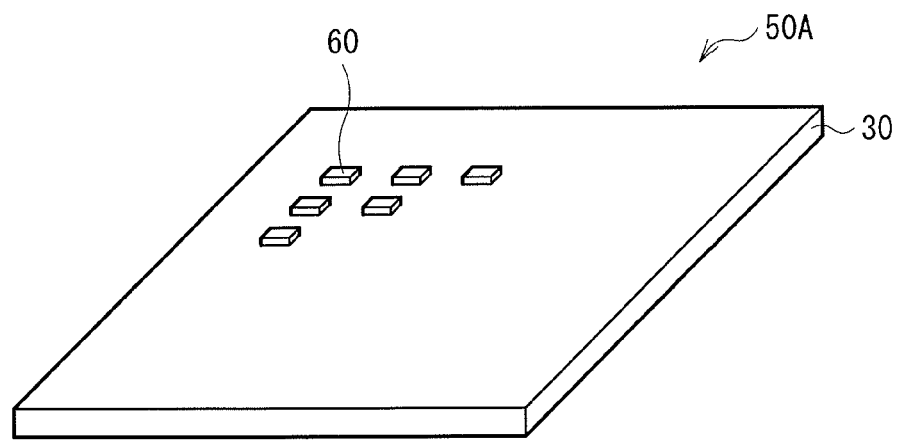
FIG. 21 is a perspective diagram illustrating an exemplary schematic configuration of a mounting board illustrated in FIG. 20.
Figure 22:
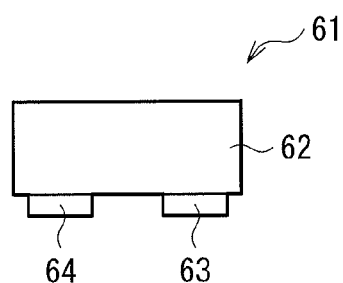
FIG. 22 is a cross-sectional diagram illustrating an exemplary configuration of a light receiving element included in a light receiving unit illustrated in FIG. 21.

The image pickup panel 50 is configured of a mounting board 50A and a counter substrate 50B stacked on each other. A surface of the counter substrate 50B serves as a light receiving surface. As illustrated in FIG. 21, the mounting board 50A corresponds to a modification of the mounting board 10A, in which a light receiving unit 60 is provided in place of the light emitting unit 40. For example, the light receiving unit 60 may correspond to a modification of the light emitting unit 40 shown in FIGS. 4 to 6, FIGS. 9 to 11, or FIGS. 14 to 16B, in which a light receiving element 61 shown in FIG. 22 is provided in place of the light emitting element 46. The light receiving element 61 includes a semiconductor layer 62 having a photoelectric conversion function, and two electrodes 63 and 64 electrically connected to the semiconductor layer 62. The electrodes 63 and 64 are provided on the same surface of the light receiving element 61, where the electrode 63 corresponds to the electrode 46-2 of the first embodiment, and the electrode 64 corresponds to the electrode 46-3 thereof.

In the second embodiment, the electrode pads 45A and 45 are connected by plating to the electrodes 63 and 64, respectively, of the light receiving element 61. Furthermore, the resin component 48, which fixes the light receiving element 61 to the element substrate 41, is provided avoiding the neighborhood of an end of the light receiving element 61 among the opposed side sections of the electrode pads 45A and 45B. Thus, when connecting operation is performed by plating in a manufacturing process, the plating solution is discharged to the outside from a region between the light receiving element 61 and the element substrate 41 through a region having no resin component 48. As a result, the plating solution less remains in the region between the light receiving element 61 and the element substrate 41.

[5. Modification of Second Embodiment]

Figure 23:
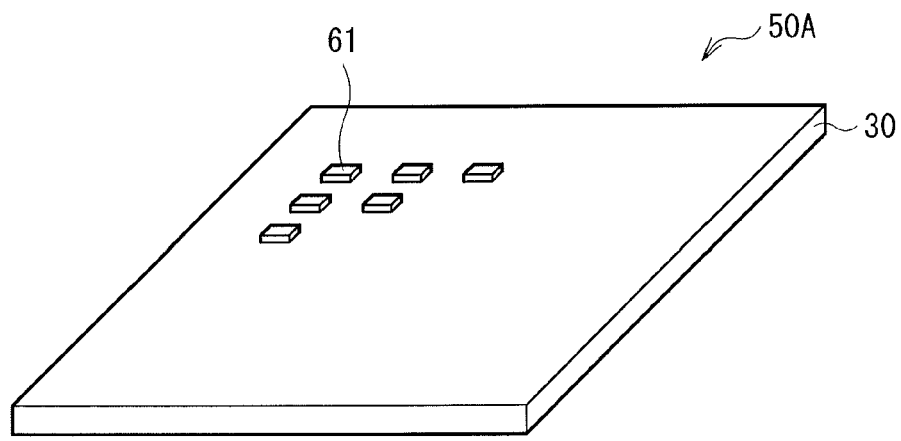
FIG. 23 is a perspective diagram illustrating an exemplary schematic configuration of a structure including the light receiving element illustrated in FIG. 22 that is directly mounted on a wiring substrate in a configuration similar to that illustrated in FIGS. 4 to 6, FIGS. 9 to 11, or FIGS. 14 to 16B.

In the second embodiment, for example, as illustrated in FIG. 23, the light receiving element 61 may be directly mounted on the wiring substrate 30 in a configuration similar to that illustrated in FIGS. 4 to 6, FIGS. 9 to 11, or FIGS. 14 to 16B. In other words, the light shielding film 44 and the electrode pads 45A and 45B may be provided on the wiring substrate 30, and furthermore the light receiving element 61 may be connected by plating to the electrode pads 45A and 45B provided on the wiring substrate 30 in a configuration similar to that illustrated in FIGS. 4 to 6, FIGS. 9 to 11, or FIGS. 14 to 16B. The resin component 48 and the light shielding film 44 are similar to those in the first embodiment.

[6. Third Embodiment]

Figure 24:
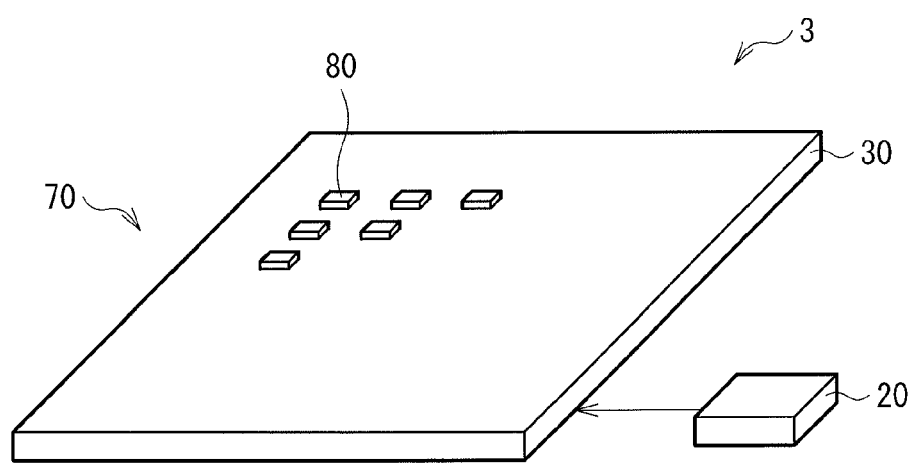
FIG. 24 is a perspective diagram illustrating an exemplary semiconductor array unit according to a third embodiment of the technology.

FIG. 24 perspectively illustrates an example of a schematic configuration of a semiconductor array unit 3 according to a third embodiment of the present technology. The semiconductor array unit 3 of the third embodiment includes a large number of semiconductor elements (for example, circuit blocks each including one or more amorphous thin film transistors (TFTs)) two-dimensionally arranged. For example, as illustrated in FIG. 24, the semiconductor array unit 3 may include a mounting board 70, and a drive circuit 20 driving the mounting board 70 (specifically, a semiconductor element 81 described later).

Figure 25:
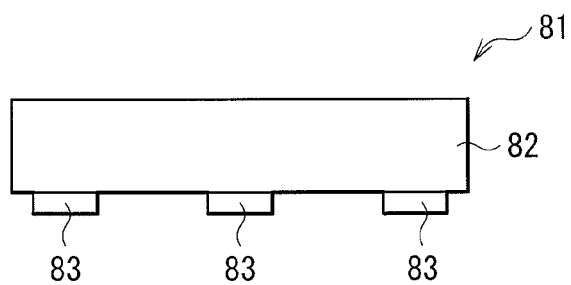
FIG. 25 is a cross-sectional diagram illustrating an exemplary configuration of a semiconductor element included in the semiconductor unit illustrated in FIG. 24.
Figure 26:
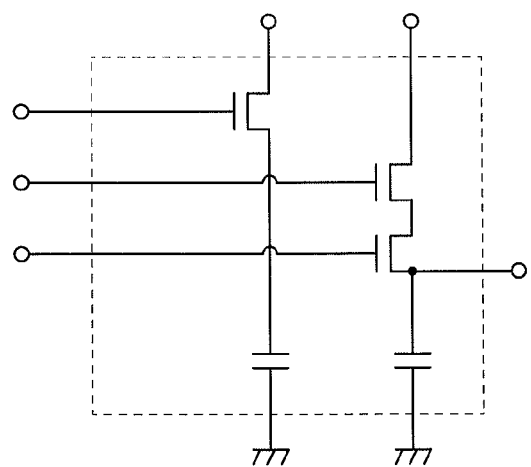
FIG. 26 is a diagram illustrating an exemplary circuit configuration of the semiconductor element illustrated in FIG. 25.

The mounting board 70 corresponds to a modification of the mounting board 10A, in which a semiconductor unit 80 is provided in place of the light emitting unit 40. For example, the semiconductor unit 80 may correspond to a modification of the light emitting unit 40 shown in FIGS. 4 to 6, FIGS. 9 to 11, or FIGS. 14 to 16B, in which a semiconductor element 81 shown in FIG. 25 is provided in place of the light emitting element 46. For example, the semiconductor element 81 may include the above-described circuit block. For example, as illustrated in FIG. 26, the circuit block may be configured of three amorphous TFTs and two capacitive elements, and, for example, may serve as a pixel circuit that drives a photoelectric conversion element.

In the third embodiment, the electrode pads 45A and 45B are each connected by plating to the electrode 83 of the semiconductor element 81. Furthermore, the resin component 48, which fixes the semiconductor element 81 to the element substrate 41, is provided avoiding the neighborhood of an end of the semiconductor element 81 among the opposed side sections of the electrode pads 45A and 45B. Thus, when connecting operation is performed by plating in a manufacturing process, the plating solution is discharged to the outside from a region between the semiconductor element 81 and the element substrate 41 through a region having no resin component 48. As a result, the plating solution less remains in the region between the semiconductor element 81 and the element substrate 41.

[7. Modification of Third Embodiment]

Figure 27:
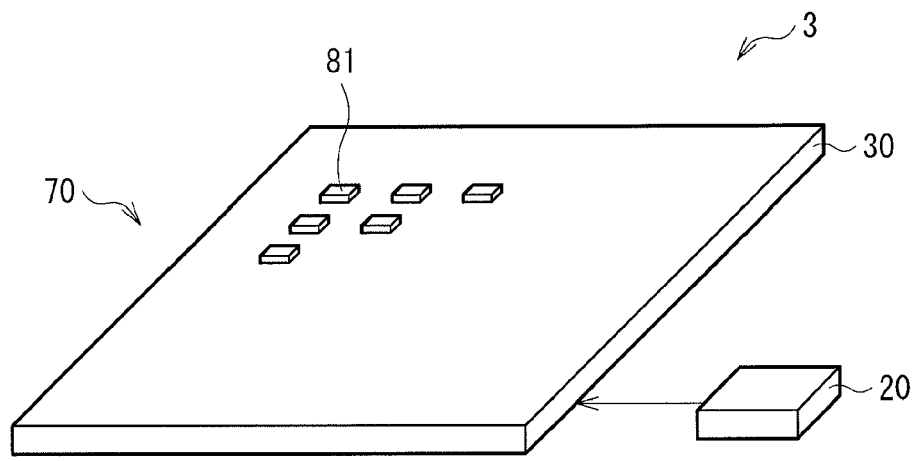
FIG. 27 is a perspective diagram illustrating an exemplary schematic configuration of a structure including the semiconductor element illustrated in FIG. 25 that is directly mounted on a wiring substrate in a configuration similar to that illustrated in FIGS. 4 to 6, FIGS. 9 to 11, or FIGS. 14 to 16B.

In the third embodiment, for example, as illustrated in FIG. 27, the semiconductor element 81 may be directly mounted on the wiring substrate 30 in a configuration similar to that illustrated in FIGS. 4 to 6, FIGS. 9 to 11, or FIGS. 14 to 16B. In other words, the light shielding film 44 and the electrode pads 45A and 45B may be provided on the wiring substrate 30, and furthermore the semiconductor element 81 may be connected by plating to the electrode pads 45A and 45B provided on the wiring substrate 30 in a configuration similar to that illustrated in FIGS. 4 to 6, FIGS. 9 to 11, or FIGS. 14 to 16B. The resin component 48 and the light shielding film 44 are similar to those in the first embodiment.

[8. Modifications Common to Above-Described Respective Embodiments]

Although the present technology has been described with some embodiments and their Modifications hereinbefore, the technology is not limited thereto, and various modifications or alterations thereof may be made.

In any of the above-described embodiments and their Modifications, the light emitting unit 40 may incorporate a drive IC that drives the light emitting element 46. Moreover, in any of the above-described embodiments and their Modifications, the light receiving unit 60 may incorporate a drive IC that drives the light receiving element 61.

Moreover, for example, although the light emitting unit 40 includes only one light emitting element 46 in any of the above-described embodiments and their Modifications, the light emitting unit 40 may include a plurality of light emitting elements 46. Moreover, although the plurality of light emitting units 40 are mounted on the mounting board 10A in any of the above-described embodiments and their Modifications, only one light emitting unit 40 may be mounted thereon. Moreover, although the plurality of light emitting units 40 are mounted in a matrix in any of the above-described embodiments and their Modifications, the light emitting units 40 may be mounted in lines.

Moreover, for example, although the light receiving unit 60 includes only one light receiving element 61 in any of the above-described embodiments and their Modifications, the light receiving unit 60 may include a plurality of light receiving elements 61. Moreover, although the plurality of light receiving units 60 are mounted on the mounting board 10A in any of the above-described embodiments and their Modifications, only one light receiving unit 60 may be mounted thereon. Moreover, although the plurality of light receiving units 60 are mounted in a matrix in any of the above-described embodiments and their Modifications, the light receiving units 60 may be mounted in lines.

Moreover, for example, the present technology may be configured as follows.

(1) A device, including:
a substrate; and
a functional element mounted on the substrate, the functional element including a plurality of electrodes disposed on one surface, wherein
the substrate includes a support substrate, and includes a first seed metal, a second seed metal, and a resin component on the support substrate,
the first seed metal being disposed in a section opposed to part or all of a first electrode among the plurality of electrodes, and being connected to the first electrode by plating,
the second seed metal being disposed in a section opposed to part or all of a second electrode among the plurality of electrodes, and being connected to the second electrode by plating, and
the resin component being disposed in a layer between the functional element and the support substrate, and fixing the functional element to the support substrate, and being provided avoiding a neighborhood of an end of the functional element among opposed side sections of the first seed metal and the second seed metal.

(2) The device according to (1), wherein the substrate has a passage that extends along the opposed side sections of the first seed metal and the second seed metal, and runs through a region between the functional element and the support substrate.

(3) The device according to (2), wherein
the first electrode has a recess,
the first seed metal is provided avoiding part or all of a section opposed to the recess, and
the passage is in communication with the recess.

(4) The device according to (3), wherein the first seed metal is configured of two divided seed metals on one surface, the divided seed metals being opposed to each other with a section opposed to the recess therebetween.

(5) The device according to any one of (2) to (4), wherein
the substrate has a light shielding film provided in a layer between the support substrate and each of the first seed metal and the second seed metal, and
the light shielding film is provided in a section that is not opposed to the resin component, but is opposed to the passage.

(6) The device according to (1), wherein
the first seed metal, the second seed metal, the first electrode, and the second electrode each have a right-angled triangle shape, the first seed metal and the second seed metal being disposed to have respective hypotenuses opposed to each other, and
the resin component is provided avoiding a section that is opposed to a region between the first seed metal and the second seed metal, but is not opposed to the functional element, and avoiding the neighborhood of the section.

(7) The device according to (6), wherein
the substrate has a light shielding film that is formed in a layer between the support substrate and each of the first seed metal and the second seed metal, and
the light shielding film is provided in a section that is not opposed to the resin component.

(8) The device according to (1), wherein
the substrate has a light shielding film that is formed in a layer between the support substrate and each of the first seed metal and the second seed metal, and
the light shielding film is provided in a section that is not opposed to the functional element.

(9) The device according to (1), wherein the functional element is one of a light emitting element and a light receiving element.

(10) An electronic apparatus, including:
a mounting board including a substrate, and a functional element mounted on the substrate, the functional element including a plurality of electrodes disposed on one surface; and
a drive section driving the functional element, wherein
the mounting board includes a support substrate, and includes a first seed metal, a second seed metal, and a resin component on the support substrate,
the first seed metal being disposed in a section opposed to part or all of a first electrode among the plurality of electrodes, and being connected to the first electrode by plating,
the second seed metal being disposed in a section opposed to part or all of a second electrode among the plurality of electrodes, and being connected to the second electrode by plating, and
the resin component being disposed in a layer between the functional element and the support substrate, and fixing the functional element to the support substrate, and being provided avoiding a neighborhood of an end of the functional element among opposed side sections of the first seed metal and the second seed metal.

The present disclosure contains subject matter related to that disclosed in Japanese Priority Patent Application JP 2012-150531 filed in the Japan Patent Office on Jul. 4, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A device, comprising:
a substrate; and
a functional element mounted on the substrate, the functional element including a plurality of electrodes disposed between a bottom surface of the functional element and a top surface of the substrate; wherein:
the substrate includes a support substrate, and includes a first seed metal, a second seed metal, and a resin component on the support substrate,
the first seed metal being disposed in a section opposed to part or all of a first electrode among the plurality of electrodes, and being connected to the first electrode by plating,
the second seed metal being disposed in a section opposed to part or all of a second electrode among the plurality of electrodes, and being connected to the second electrode by plating, and
the resin component being disposed in a layer between the functional element and the support substrate, and fixing the functional element to the support substrate, and being between the first electrode and the second electrode and separated from the first electrode, the second electrode, the first seed metal, and the second seed metal.

2. The device according to claim 1, wherein the substrate has a passage that extends along side sections of the first seed metal and the second seed metal that oppose each other and the resin component, and runs through a region between the functional element and the support substrate.

3. The device according to claim 2, wherein
the first electrode has a recess,
the first seed metal is provided avoiding part or all of a section opposed to the recess, and
the passage is in communication with the recess.

4. The device according to claim 3, wherein the first seed metal is configured of two divided seed metals on one surface, the divided seed metals being opposed to each other with a section opposed to the recess therebetween.

5. The device according to claim 2, wherein
the substrate has a light shielding film provided in a layer between the support substrate and each of the first seed metal and the second seed metal, and
the light shielding film is provided in a section that is not opposed to the resin component, but is opposed to the passage.

6. The device according to claim 1, wherein
the first seed metal, the second seed metal, the first electrode, and the second electrode each have a right-angled triangle shape, the first seed metal and the second seed metal being disposed to have respective hypotenuses opposed to each other, and
the resin component is provided avoiding a section that is opposed to a region between the first seed metal and the second seed metal, but is not opposed to the functional element, and avoiding the neighborhood of the section.

7. The device according to claim 6, wherein
the substrate has a light shielding film that is formed in a layer between the support substrate and each of the first seed metal and the second seed metal, and
the light shielding film is provided in a section that is not opposed to the resin component.

8. The device according to claim 1, wherein
the substrate has a light shielding film that is formed in a layer between the support substrate and each of the first seed metal and the second seed metal, and
the light shielding film is provided in a section that is not opposed to the functional element.

9. The device according to claim 1, wherein the functional element is one of a light emitting element and a light receiving element.

10. An electronic apparatus, comprising:
a mounting board including a substrate, and a functional element mounted on the substrate, the functional element including a plurality of electrodes disposed between a bottom surface of the functional element and a top surface of the substrate; and a drive section driving the functional element, wherein:
the mounting board includes a support substrate, and includes a first seed metal, a second seed metal, and a resin component on the support substrate,
the first seed metal being disposed in a section opposed to part or all of a first electrode among the plurality of electrodes, and being connected to the first electrode by plating,
the second seed metal being disposed in a section opposed to part or all of a second electrode among the plurality of electrodes, and being connected to the second electrode by plating, and
the resin component being disposed in a layer between the functional element and the support substrate, and fixing the functional element to the support substrate, and being between the first electrode and the second electrode and separated from the first electrode, the second electrode, the first seed metal, and the second seed metal.

\* \* \* \* \*